United States Patent
Miyazaki

(10) Patent No.: US 7,141,120 B2
(45) Date of Patent: Nov. 28, 2006

(54) MANUFACTURING APPARATUS OF SEMICONDUCTOR DEVICE HAVING INTRODUCING SECTION AND WITHDRAWING SECTION

(75) Inventor: Kunihiro Miyazaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 10/305,166

(22) Filed: Nov. 27, 2002

(65) Prior Publication Data

US 2003/0099535 A1    May 29, 2003

Related U.S. Application Data

(63) Continuation of application No. PCT/JP02/02892, filed on Mar. 26, 2002.

(30) Foreign Application Priority Data

Mar. 28, 2001    (JP)    ............... 2001-092543

(51) Int. Cl.
  C23C 16/00    (2006.01)
  H01L 12/306    (2006.01)
  C23F 1/00    (2006.01)
(52) U.S. Cl. .............. 118/719; 156/345.31; 414/935; 414/937; 414/940
(58) Field of Classification Search ............... 118/719; 156/345.31; 414/940, 937, 217–221
See application file for complete search history.

(56) References Cited

U.S. PATENT DOCUMENTS

| | | | |
|---|---|---|---|
| 4,672,185 A * | 6/1987 | Sato et al. ............... | 235/375 |
| 4,682,927 A * | 7/1987 | Southworth et al. ....... | 414/217 |
| 5,695,564 A * | 12/1997 | Imahashi ................ | 118/719 |
| 5,924,833 A * | 7/1999 | Conboy et al. .......... | 414/217 |
| 6,322,597 B1 | 11/2001 | Ohta | |
| 6,328,768 B1 * | 12/2001 | Ohta ..................... | 29/25.01 |
| 6,336,546 B1 * | 1/2002 | Lorenz ................... | 198/346.2 |
| 6,594,546 B1 * | 7/2003 | Elger ..................... | 700/225 |
| 6,623,231 B1 * | 9/2003 | Elger .................... | 414/331.01 |
| 6,643,558 B1 * | 11/2003 | Huber et al. ............ | 700/112 |
| 6,670,568 B1 * | 12/2003 | Goetzke ................. | 209/567 |
| 6,887,358 B1 * | 5/2005 | Elger .................... | 204/298.35 |

FOREIGN PATENT DOCUMENTS

| | | |
|---|---|---|
| EP | 0 292 236 | 11/1988 |
| EP | 0 292 236 A2 | 11/1988 |
| EP | 0 948 031 A2 | 10/1999 |
| JP | 3-67304 | 3/1991 |
| JP | 2792800 | 6/1998 |
| JP | 11-283892 | 10/1999 |

OTHER PUBLICATIONS

Notification for Filing Opinion issued by Korean Patent Office, mailed Sep. 24, 2004, for Korean Application NO. 10-2002-7016067, and English-language translation.

* cited by examiner

*Primary Examiner*—Karla Moore
(74) *Attorney, Agent, or Firm*—Finnegan, Henderson, Farabow, Garrett & Dunner, L.L.P.

(57) ABSTRACT

A manufacturing apparatus of a semiconductor device includes an introducing section, a process section, and a withdrawing section. The introducing section introduces a transfer box therein. The process section takes in the semiconductor substrate put in the introducing section and applies a prescribed processing to the semiconductor substrate. Further, the withdrawing section is arranged on a surface differing from the surface on which the introducing section is arranged and discharges the transfer box holding the semiconductor substrate withdrawn from the process section of the semiconductor substrate.

11 Claims, 6 Drawing Sheets

→ Flow of box housing semiconductor substrate
---→ Flow of vacant box

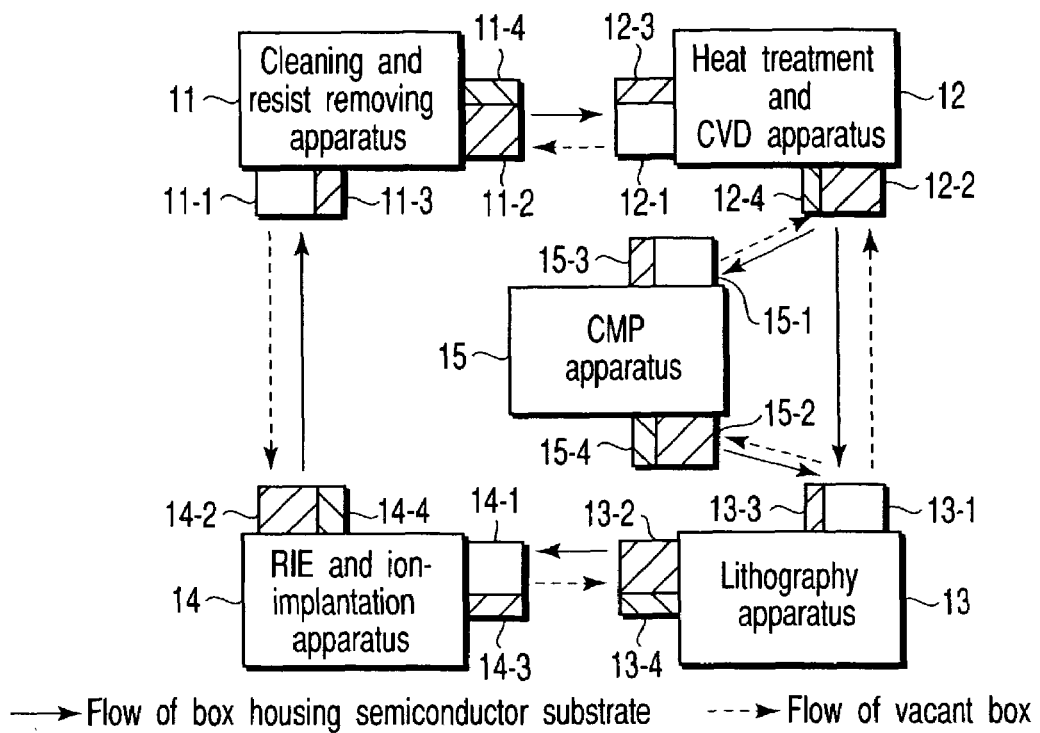
F I G. 8
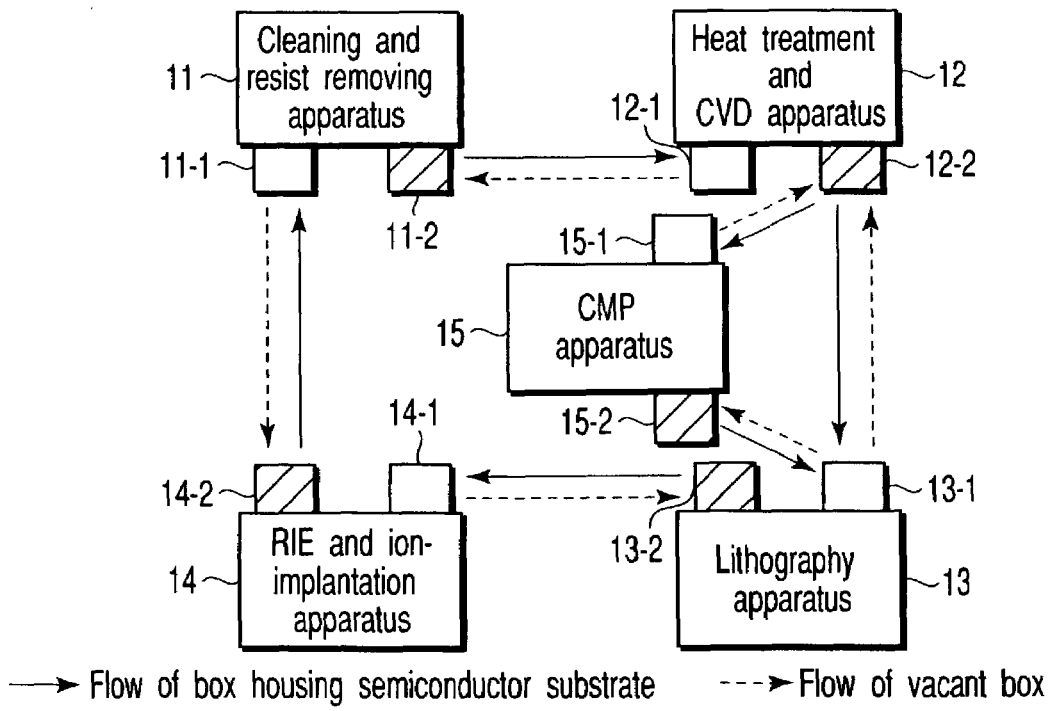
F I G. 9

MANUFACTURING APPARATUS OF SEMICONDUCTOR DEVICE HAVING INTRODUCING SECTION AND WITHDRAWING SECTION

CROSS-REFERENCE TO RELATED APPLICATIONS

This is a Continuation Application of PCT Application No. PCT/JP02/02892, filed Mar. 26, 2002, which was not published under PCT Article 21(2) in English.

This application is based upon and claims the benefit of priority from the prior Japanese Patent Application No. 2001-092543, filed Mar. 28, 2001, the entire contents of which are incorporated herein by reference.

BACKGROUND OF THE INVENTION

1. Field of the Invention

The present invention relates to a manufacturing apparatus of a semiconductor device having an introducing section and withdrawing section, particularly relates to a layout of manufacturing apparatuses of a semiconductor device, which permits improving the transfer efficiency of a semiconductor article within a clean room.

2. Description of the Related Art

In the manufacturing process of a semiconductor device, semiconductor substrates are handled in general in a supervising unit called a lot consisting of 13 semiconductor substrates or 24 or 25 semiconductor substrates. Also, the semiconductor substrates handled in a unit of a lot are housed in a semiconductor substrate housing container called a carrier. In a clean room in which the semiconductor device is actually manufactured, the semiconductor substrates, which are set in a cassette or a carrier, are housed in a semiconductor substrate transfer box so as to be transferred and stored.

There are several methods of introducing the semiconductor substrates, which are supervised as described above, into a manufacturing apparatus of a semiconductor device, hereinafter referred to simply as "a manufacturing apparatus", arranged within the clean room, as summarized below:

(1) A cassette housing the semiconductor substrates is taken out of the transfer box so as to be set in the manufacturing apparatus.

(2) The transfer box housing the semiconductor substrates are set in the manufacturing apparatus, with the lid of the transfer box left open.

(3) The transfer box housing the semiconductor substrates are set in the manufacturing apparatus, with the lid of the transfer box kept closed.

In methods (1) and (2) given above, required is a manual operation performed by the operator in taking out the cassette from the transfer box and in opening the lid of the transfer box. The particular cassette is called an open cassette.

On the other hand, method (3) given above does not require a manual operation, and the semiconductor substrate is automatically taken in by the manufacturing apparatus. For example, the manufacturing apparatus automatically opens the lid of the transfer box so as to take in the semiconductor substrate. Alternatively, if the transfer box is set in the manufacturing apparatus, the manufacturing apparatus takes in the transfer box itself and opens the lid of the transfer box inside the manufacturing apparatus so as to take out the semiconductor substrate from the cassette.

The layout of the particular manufacturing apparatuses within a clean room will now be described with reference to FIG. 1 showing a partial region of the clean room.

As shown in the drawing, a clean room 100 includes a utility area 120 and a working area 130. The utility area 120 is partitioned from the working area 130 by a wall, and various manufacturing apparatuses 110-1 to 110-14 are arranged within the utility area 120. The working area 130, which is the region other than the utility area 120, has a cleanliness higher than that of the utility area 120. A semiconductor substrate introducing section (loader section) 111 and a semiconductor substrate withdrawing section (unloader section) 112 are included in each of the manufacturing apparatuses 110-1 to 110-14. The semiconductor substrate is introduced into the manufacturing apparatus through the semiconductor substrate introducing section 111, and is withdrawn from the manufacturing apparatus through the semiconductor substrate withdrawing section 112. Only these introducing section 111 and withdrawing section 112 extend from the utility area 120 so as to be exposed to the working area 130. The transfer of each semiconductor substrate and, in some cases, various manual operations are carried out within the working area 130.

As described above, the clean room is partitioned in general into a region requiring a high cleanliness (working area) and another region that does not require a high cleanliness (utility area).

If manufacturing apparatuses are to be efficiently installed within a clean room which is partitioned into a plurality of regions based on the required cleanliness, the manufacturing apparatuses 110-1 to 110-14 are to be arranged side by side as shown in FIG. 1. In this case, the working area 130 is in the form of a passageway.

There are two methods of handling the semiconductor substrates before and after the processing, as summarized below:

(1) The semiconductor substrates, which are housed in a certain cassette before the processing, are housed in another cassette after the processing.

(2) The semiconductor substrates after the processing are housed in the cassette previously used for housing the semiconductor substrates before the processing.

Which of the methods (1) and (2) given above to employ is determined by the specification of the manufacturing apparatus and by the layout of the clean room in which the manufacturing apparatuses are installed and the operating policy of the clean room.

Where the semiconductor substrates after the processing are not brought back to the cassette housing the semiconductor substrates before the processing as in method (1) given above, the semiconductor substrate introducing section and the semiconductor substrate withdrawing section are arranged to form a pair on the front surface of the manufacturing apparatus, as shown in FIG. 1.

Where the semiconductor substrates after the processing are housed in the cassette housing the semiconductor substrates before the processing as in method (2) given above, it is possible for a single section to act both as a semiconductor substrate introducing section and as a semiconductor substrate withdrawing section. The cassette in which the same semiconductor substrates are set both before and after the processing is generally called a uni-cassette. To be more specific, at least one section acting both as a semiconductor substrate introducing section and as a semiconductor substrate withdrawing section is formed in the front surface of the manufacturing apparatus that is operated by using a uni-cassette. Incidentally, in the case of using a uni-cassette, the same transfer box housing the cassette is used in general both before and after the processing of the semiconductor substrate.

However, above-noted methods (1) and (2) for handling the semiconductor substrate both before and after the processing of the semiconductor substrate are advantageous in some respects and disadvantageous in other respects, making it difficult to determine which method is the best method.

First of all, method (1), in which the semiconductor substrates after the processing are not brought back to the cassette previously housing the semiconductor substrates before the processing, will now be described with reference to FIG. 1. The arrows of the solid lines shown in FIG. 1 denote the flow of the transfer box housing the semiconductor substrates, and the arrows of the broken lines denote the flow of the vacant transfer box. Suppose, for example, that the semiconductor substrate is processed in the manufacturing apparatuses 110-12, 110-3 and 110-4 in the order mentioned.

In the first step, the transfer box housing the semiconductor substrate processed in the manufacturing apparatus 110-12 is set in the semiconductor substrate introducing section 111 of the manufacturing apparatus 110-3. Also, a vacant transfer box is set in the semiconductor substrate withdrawing section 112 of the manufacturing apparatus 110-3. In the manufacturing apparatus 110-3, a prescribed processing is applied to the semiconductor substrate housed in the transfer box set in the semiconductor substrate introducing section 111. After completion of the processing, the processed semiconductor substrate is housed in the vacant transfer box set in the semiconductor substrate withdrawing section 112. The transfer box housing the processed semiconductor substrate is set in the semiconductor substrate introducing section 111 of the next manufacturing apparatus 110-4.

On the other hand, the transfer box set in the semiconductor substrate introducing section 111 of the manufacturing apparatus 110-3 becomes vacant. The vacant transfer box is set again in the semiconductor substrate withdrawing section 112 of, for example, the manufacturing apparatus 110-12 used for applying the previous processing to the semiconductor substrate. In this case, the transfer box reciprocating between the manufacturing apparatus 110-12 and the manufacturing apparatus 110-3 is allowed to maintain the same cleanliness. Also, the transfer box that has been become vacant provides a transfer box for receiving the next semiconductor substrate and, thus, is transferred to another process step. Alternatively, it is possible for the vacant transfer box to be washed and, then, transferred for receiving the next semiconductor substrate. In this case, the semiconductor substrate after the processing is housed in a new transfer box. It follows that the semiconductor substrate is not contaminated within the transfer box. Naturally, the cleanliness of the semiconductor substrate is not impaired.

However, in the handling method of the semiconductor substrate described above, problems are generated that the efficiency of the cleanliness supervision of the entire clean room becomes poor, and that the operation and supervision of the transfer box become troublesome. To be more specific, the cleanliness required for the transfer box differs depending on the process steps. For example, the semiconductor substrate in the process step falling within a range of between the etching step and the resist removing step is coated with a resist film. Therefore, it suffices for the cleanliness of the transfer box for transferring the semiconductor substrate between the process steps falling within the range noted above to be relatively low. On the other hand, the transfer box used in the steps falling within a range of between the cleaning step and the film-deposition step requires a very high cleanliness.

In the case of the layout of the manufacturing apparatuses as shown in FIG. 1, moved within the working area 130 are the semiconductor substrate which is to be maintained at a high cleanliness, the semiconductor substrate to which are attached a resist material and a reactive gas, the transfer box storing the semiconductor substrate, the cassette, and the vacant transfer box. Since the transfer boxes differing from each other in the cleanliness are moved within the same site, it is difficult to supervise efficiently the cleanliness of the clean room. Further, since the transfer boxes having various degrees of cleanliness are present within the working area 130, the operation and supervision of the working area 130 become troublesome and complex.

It should also be noted that it is necessary to put in the transfer box a supervising tag indicating the information on the semiconductor substrate housed in the transfer box and the information on the present process stage of the semiconductor substrate. In the case of method (1), the transfer box is replaced every time the processing performed in the manufacturing apparatus. Therefore, it is necessary to transfer the supervising tag put in the semiconductor substrate introducing section into the transfer box positioned in the semiconductor substrate withdrawing section. It follows that the supervision of the transfer box become troublesome in this respect, too.

On the other hand, in the case of method (2) using a uni-cassette, the semiconductor substrate processed in the manufacturing apparatus is brought back into the transfer box previously housing the semiconductor substrate before the processing. It follows that the transfer box does not become vacant, with the result that the supervision of the transfer box can be simplified and, at the same time, the problem relating to the supervising tag can be solved.

However, in the case of using a uni-cassette, a new problem is generated that it is difficult to maintain the cleanliness within the transfer box. For example, the semiconductor substrate after the lithography process is coated with a resist film, with the result that it is possible for the resist to be attached to the cassette. Further, suppose that an etching treatment is performed in, for example, a dry etching apparatus in the next step. In this case, the cassette adsorbs the reactive gas attached to the semiconductor substrate and released from the semiconductor substrate in the dry etching step. It follows that, if various processes are performed successively, the chemical solution, the gas, etc., used in the processing are attached to the transfer box every time the processing is performed.

The contamination of the transfer box noted above is a serious problem. Even if the semiconductor substrate is cleansed by removing the resist from the semiconductor substrate and by washing the semiconductor substrate, the cleanliness of the semiconductor substrate becomes poor because the inner region of the transfer box is contaminated with the resist or the reactive gas. In this fashion, the use of a uni-cassette gives rise to the problem that the transfer box and the cassette are contaminated with progress of the processing, and the semiconductor substrate is also contaminated in accordance with contamination of the transfer box and the cassette.

The conventional layout of another manufacturing apparatuses in a clean room will now be described with reference to FIG. 2.

As shown in the drawing, the working area within the clean room 100 is divided into three working areas 130-1, 130-2 and 1303 depending on the cleanliness required for the transfer box. Also, the kinds of the manufacturing apparatuses that are to be installed in the utility areas 120-1 to 120-4 are determined in accordance with the cleanliness of the working area. Further, the transfer boxes are classified depending on the cleanliness thereof into a transfer box to which resist is attached, a transfer box of a low cleanliness to which is attached a gas in, for example, the etching process, and a transfer box of a high cleanliness used in the film-deposition processing and requiring a very high cleanliness. It should be noted that the working areas 130-1 to 130-3 provide a zone in which are moved the transfer boxes having various degrees of the cleanliness noted above.

In the case of the clean room of the construction described above, only the transfer boxes having substantially the same cleanliness are moved within each working area so as to facilitate the supervision of the cleanliness within the clean room and the operation and supervision of the transfer box. On the other hand, where the transfer box is transferred between the working areas differing from each other in the level of the cleanliness, the transfer distance becomes long. At the same time, the transfer of the transfer box becomes highly complex, with the result that it is difficult to supervise the transfer box.

In the method using a uni-cassette, the problem referred to above remains unsolved even if the layout of the clean room is changed.

In conclusion, it is very difficult to maintain the required cleanliness of the semiconductor substrate by the apparatus construction of the uni-cassette alone. Under the circumstances, it is necessary to use an exclusive apparatus equipped with a replacing mechanism for replacing the transfer box and the cassette for maintaining the required cleanliness or a manufacturing apparatus equipped with a mechanism including a semiconductor substrate introducing-withdrawing section and replacing the transfer box before and after the processing. However, if the transfer box is transferred by introducing these apparatuses, the transfer of the transfer box housing the semiconductor substrate and the vacant transfer box becomes highly complex.

As described above, if the semiconductor substrate is transferred by using a uni-cassette in the conventional manufacturing apparatus and the manufacturing system of the semiconductor device, it is possible to obtain the merit that the transferring supervision of the transfer box is facilitated and the supervising tag need not be moved. However, the conventional technology gives rise to the problem that it is difficult to maintain the required cleanliness of the semiconductor substrate because the inner region of the transfer box is contaminated every time the processing is performed.

Also, in the system in which the semiconductor substrate after the processing is housed in a transfer box differing from the transfer box housing previously the semiconductor substrate before the processing, the required cleanliness within the transfer box can be maintained easily. In this case, however, it is necessary to move the supervising tag every time the processing is performed within the manufacturing apparatus. Also, the transferring route of the transfer box becomes complex. As a result, a problem is generated that the supervision in the cleanliness of the clean room and the transferring supervision of the transfer box become complex and difficult.

BRIEF SUMMARY OF THE INVENTION

A manufacturing apparatus of a semiconductor device according to an aspect of the present invention comprises:

an introducing section configured to introduce a first transfer box holding the semiconductor substrate therein;

a process section which takes in the semiconductor substrate put in the introducing section and applies a processing to the semiconductor substrate; and a withdrawing section which is arranged on a surface differing from the surface on which the introducing section is arranged and which is configured to withdraw a second transfer box holding the semiconductor substrate discharged from the process section, the second transfer box differing from the first transfer box.

A manufacturing system of a semiconductor device according to an aspect of the present invention comprises:

a plurality of manufacturing apparatuses of a semiconductor device each including an introducing section configured to introduce a first transfer box holding the semiconductor substrate therein, a process section which takes in the semiconductor substrate put in the introducing section and applies a processing to the semiconductor substrate, and a withdrawing section configured to withdraw a second transfer box holding the semiconductor substrate discharged from the process section, the second transfer box differing from the first transfer box, the withdrawing section of at least one of the manufacturing apparatuses being arranged to face the introducing section of the adjacent manufacturing apparatus, and the withdrawing section and the introducing section of at least one of the manufacturing apparatuses being arranged on different surfaces of the manufacturing apparatus.

BRIEF DESCRIPTION OF THE SEVERAL VIEWS OF THE DRAWING

FIG. 8 shows a layout of manufacturing apparatuses of a semiconductor device according to a fourth embodiment of the present invention; and FIG. 9 shows a layout of manufacturing apparatuses of a semiconductor device according to a modification of the first to fourth embodiments of the present invention.

DETAILED DESCRIPTION OF THE INVENTION

Figure 1:
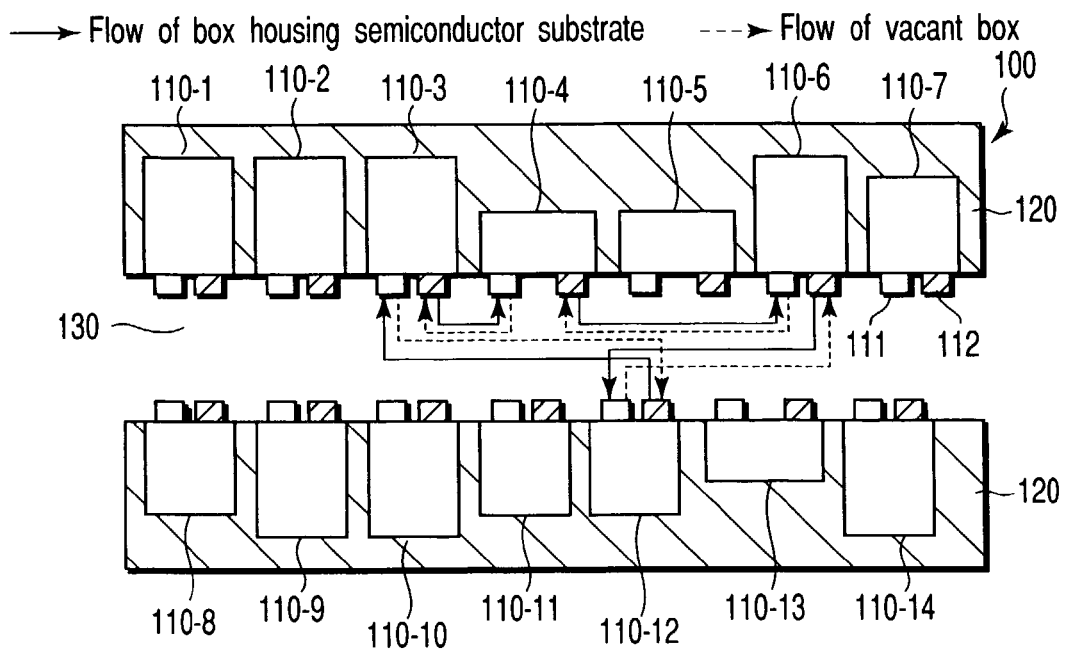
FIG. 1 shows a conventional layout of manufacturing apparatuses of a semiconductor device within a clean room.
Figure 2:
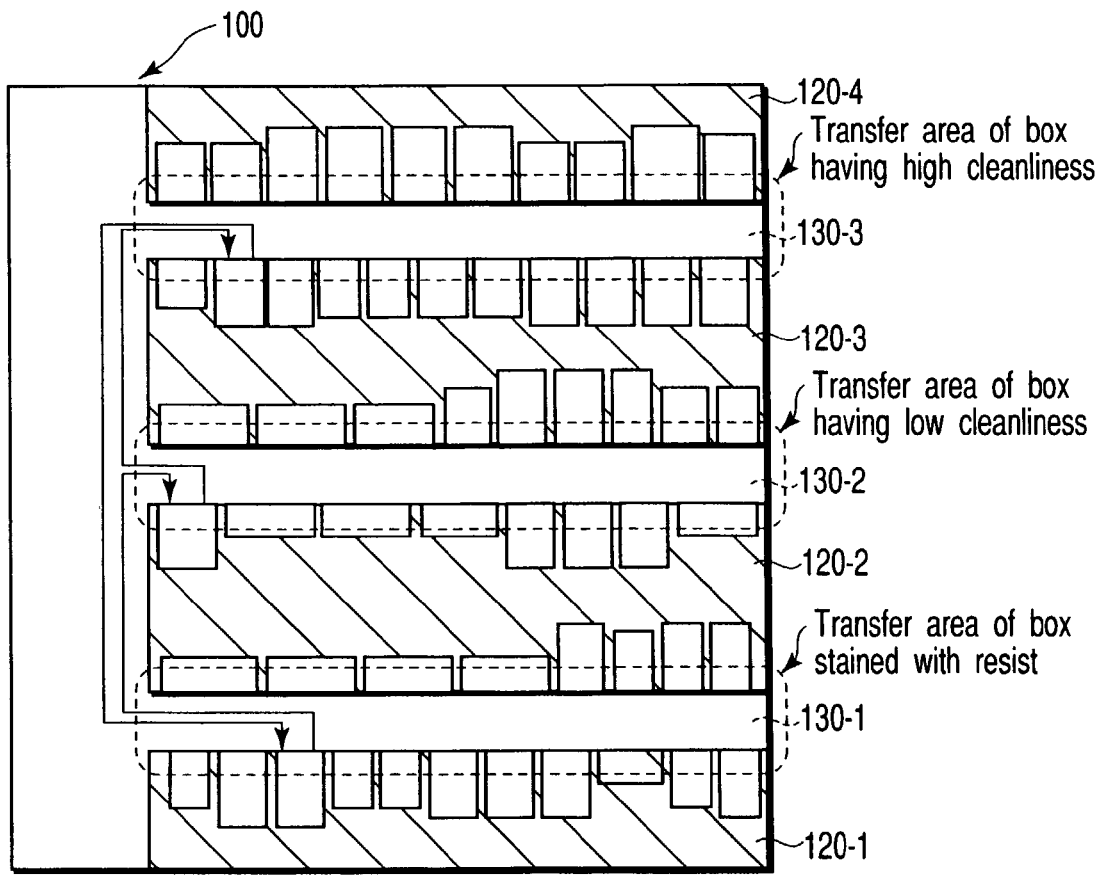
FIG. 2 shows another conventional layout of manufacturing apparatuses of a semiconductor device within a clean room.
Figure 3:
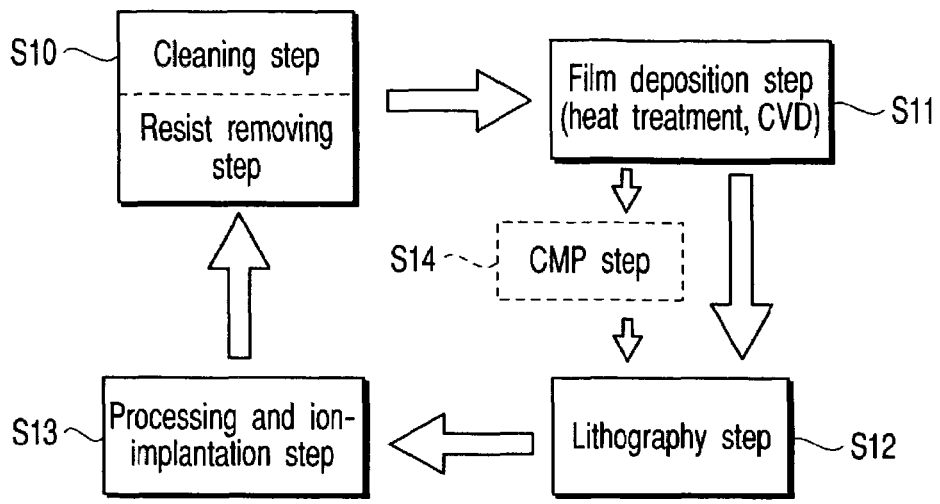
FIG. 3 is a flow chart showing the manufacturing process of a semiconductor device, which is used for describing a clean room according to a first embodiment of the present invention.

A manufacturing apparatus and a manufacturing system of a semiconductor device according to a first embodiment of the present invention will now be described with reference to FIGS. 3 and 4. FIG. 3 is a flow chart showing the manufacturing process of a semiconductor device, and FIG. 4 shows a layout of manufacturing apparatuses of a semiconductor device.

First of all, the typical flow in the manufacturing process of a semiconductor device will now be described with reference to FIG. 3.

In the manufacturing process of a semiconductor device, a semiconductor substrate put on the manufacturing line of a semiconductor device is processed in various manufacturing apparatuses of a semiconductor device (the manufacturing apparatus of a semiconductor device being hereinafter referred to simply as "manufacturing apparatus") until the manufacture is finished. The manufacturing process is basically a repetition of a cleaning step (step S10)→a film-deposition step (heat treatment, CVD (Chemical Vapor Deposition), etc.; step S11)→a lithography step (step S12) →a processing step (dry etching, wet etching, etc.) or an ion implantation step (step S13)→a cleaning step (resist removing; step S10)→etc. In some cases, a CMP (Chemical Mechanical Polishing) step (step S14) is performed after the film-deposition step.

Figure 4:
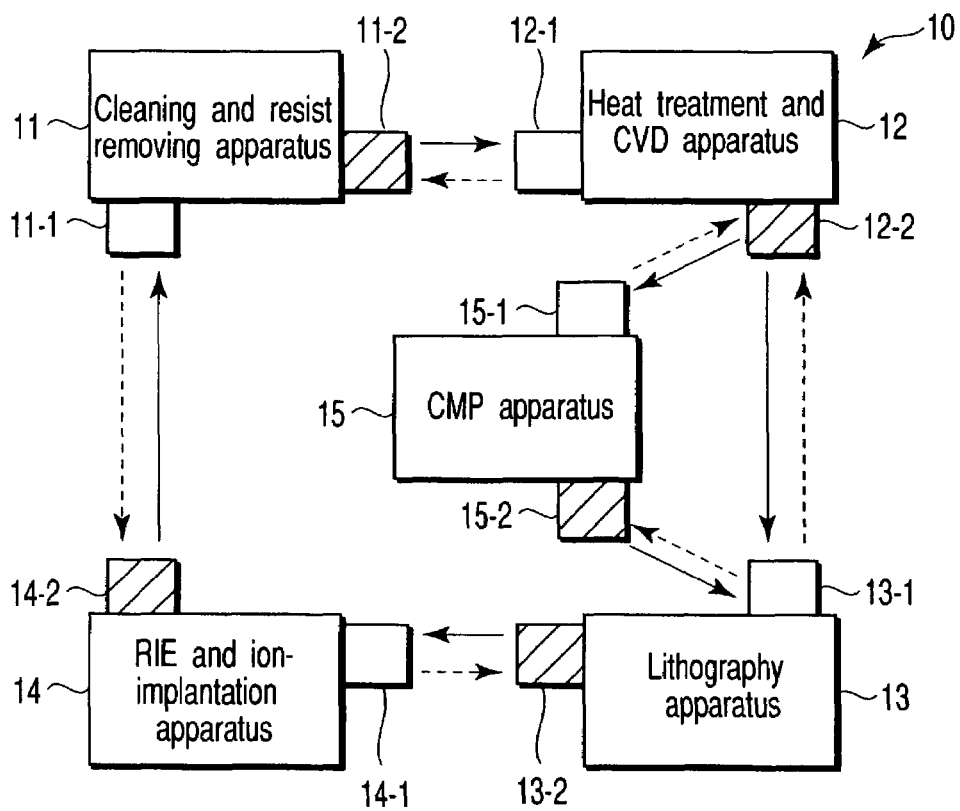
FIG. 4 shows a layout of manufacturing apparatuses of a semiconductor device according to the first embodiment of the present invention.

FIG. 4 shows a layout of the manufacturing apparatus within a clean room, which is determined in view of the flow of the manufacturing process of the semiconductor device referred to above. The concept of the utility area or the working area is excluded from the layout shown in FIG. 4. The conventional clean room is based on the idea that the cleanliness of the entire clean room is increased in order to prevent the contamination of the semiconductor substrate. However, because of the development of the manufacturing apparatus which permits automatically taking the semiconductor substrate out of the transfer box, it has become possible to carry out the delivery of the semiconductor substrate among different manufacturing apparatuses without causing the semiconductor substrate housed in the transfer box to be exposed to the outside. Therefore, it has become possible to maintain the cleanliness of the semiconductor substrate within the transfer box by increasing the cleanliness within the transfer box. In this case, the cleanliness can be maintained within the transfer box except the time when the semiconductor substrate is processed within the manufacturing apparatus. As a result, it is unnecessary to ensure a space of a high cleanliness called a working area. The first embodiment of the present invention is based on the idea that the working area and the utility area are not particularly formed in the clean room, and the cleanliness of the semiconductor substrate is maintained by the transfer boxy while lowering the cleanliness of the entire clean room.

As shown in FIG. 4, arranged within a clean room 10 are a cleaning and resist removing apparatus 11 for performing the cleaning and resist removing step S10, a heat treatment and CVD apparatus 12 for performing the film-deposition step S11, a lithography apparatus 13 for performing the lithography step S12, and an RIE (Reactive Ion Etching) and ion implantation apparatus 14 for performing the processing and the ion implantation step S13. These apparatuses 11 to 14 are arranged to form a square layout. In other words, these four apparatuses 11 to 14 are positioned at the four corners of the square configuration. Also, a CMP apparatus 15 for performing the CMP step S14 is positioned inside the square. In other words, the various manufacturing apparatuses can be arranged in a manner to reflect the flow of the flow chart shown in FIG. 3 by eliminating the working area and the utility area.

Because of the particular arrangement of the manufacturing apparatuses described above, it is possible to arrange the semiconductor substrate withdrawing section of each manufacturing apparatus in a manner to face the semiconductor substrate introducing section of the manufacturing apparatus for performing the next process step. In other words, the semiconductor substrate introducing section is arranged to face the semiconductor substrate withdrawing section of the manufacturing apparatus used for performing the preceding process step.

To be more specific, the semiconductor substrate introducing section 11-1 of the cleaning and resist removing apparatus 11 is arranged to face the semiconductor substrate withdrawing section 14-2 of the RIE and ion implantation apparatus 14, as shown in FIG. 4. Also, the semiconductor substrate withdrawing section 11-2 of the cleaning and resist removing section 11 is arranged to face the semiconductor substrate introducing section 12-1 of the heat treatment and CVD apparatus 12. The semiconductor substrate withdrawing section 12-2 of the heat treatment and CVD apparatus 12 is arranged to face the semiconductor substrate introducing section 13-1 of the lithography apparatus 13. The semiconductor substrate withdrawing section 13-2 of the lithography apparatus 13 is arranged to face the semiconductor substrate introducing section 14-1 of the RIE and ion implantation apparatus 14. The semiconductor substrate introducing section 15-1 of the CMP apparatus 15 is arranged to face the semiconductor substrate withdrawing section 12-2 of the heat treatment and CVD apparatus 12. Further, the semiconductor substrate withdrawing section 15-2 of the CMP apparatus 15 is arranged to face the semiconductor substrate introducing section 13-1 of the lithography apparatus 13.

As a result, the semiconductor substrate introducing section and the semiconductor substrate withdrawing section of each manufacturing apparatus are formed on different surfaces of the manufacturing apparatus. It should also be noted that the flow of the transfer box housing the semiconductor substrate becomes constant as denoted by arrows of solid lines shown in the drawing (flow in the clockwise direction). On the other hand, the flow of the vacant transfer box becomes constant as denoted by arrows of broken lines (flow in the counterclockwise direction).

According to the embodiment described above, the clean room is not partitioned into a working area and a utility area, and the cleanliness of the semiconductor substrate is maintained within the transfer box. As a result, it is unnecessary to arrange the manufacturing apparatuses side by side within the utility area as in the prior art so as to markedly improve the degree of freedom in the layout of the manufacturing apparatuses.

If the degree of freedom in the layout is increased, it is possible to arrange the various manufacturing apparatuses along the flow of the manufacturing process of the semiconductor device, as shown in FIG. 4. Where the various manufacturing apparatuses are arranged along the flow of the manufacturing process in this fashion so as to optimize the transfer route of the semiconductor substrate, it is desirable for the semiconductor substrate introducing section and the semiconductor substrate withdrawing section of each manufacturing apparatus to be formed on different surfaces of the manufacturing apparatus. Also, the flow of the transfer box can be made constant such that the flow of the transfer box housing the semiconductor substrate becomes constant (flow in the clockwise direction), and the flow of the vacant transfer box also becomes constant (flow in the counterclockwise direction) in the example shown in FIG. 4. It follows that the transferring supervision of the transfer box can be simplified and can be made efficient.

The simplest system in the manufacturing process of the semiconductor device is taken up in the first embodiment of the present invention described above. However, the actual manufacturing plant of the semiconductor device generally comprises a larger number of manufacturing apparatuses for operation of the manufacturing plant. An embodiment of the present invention in such a case will now be described.

Figure 5:
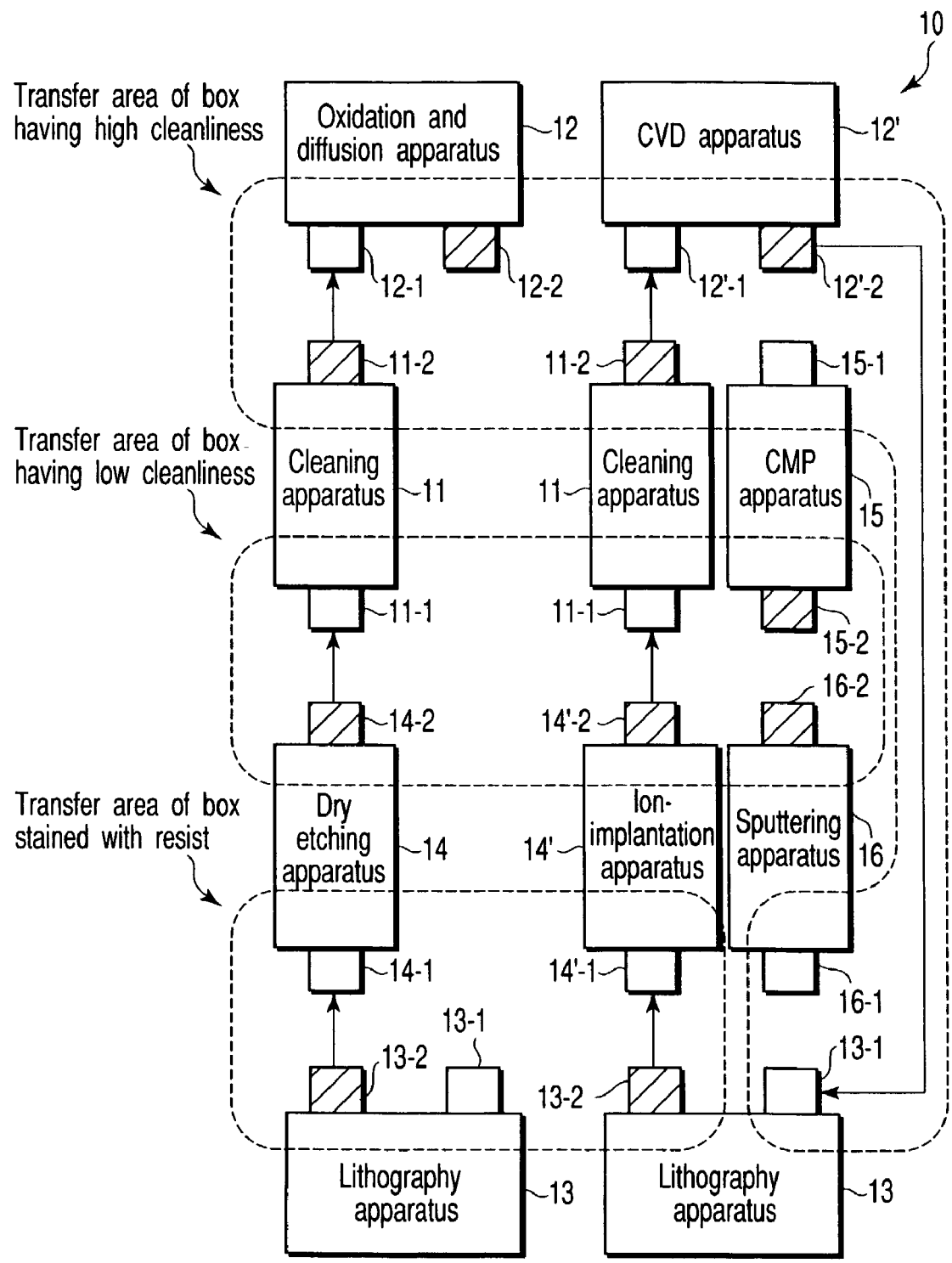
FIG. 5 shows a layout of manufacturing apparatuses of a semiconductor device according to a second embodiment of the present invention.

A manufacturing apparatus and a manufacturing system of a semiconductor device according to a second embodiment of the present invention will now be described with reference to FIG. 5. FIG. 5 shows the layout of the manufacturing apparatuses. The layout shown in FIG. 5 is designed to permit the semiconductor substrate to be transferred constant in the clockwise direction in accordance with the flow chart shown in FIG. 3, as in the first embodiment described above.

As shown in FIG. 5, arranged within the clean room 10 are two cleaning apparatuses 11, an oxidation and diffusion apparatus 12, a CVD apparatus 12', two lithography apparatuses 13, a dry etching apparatus 14, an ion implantation apparatus 14', a CMP apparatus 15 and a sputtering apparatus 16.

The lithography apparatus 13 includes a semiconductor substrate introducing section 13-1 and a semiconductor substrate withdrawing section 13-2, which are formed on the same surface of the lithography apparatus 13. The dry etching apparatus 14 and the ion implantation apparatus 14' include a semiconductor substrate introducing sections 14-1, 14'-1, and semiconductor substrate withdrawing sections 14-2, 14'-2, respectively. The semiconductor substrate introducing sections 14-1 and 14'-1 are formed on the surfaces facing the two lithography apparatuses 13, respectively. On the other hand, the semiconductor substrate withdrawing sections 14-2 and 14'-2 are formed on the surfaces opposite to the surfaces on which the semiconductor substrate introducing sections 14-1 and 14'-1 are formed. The two cleaning apparatuses 11 include semiconductor substrate introducing sections 11-1 formed on the surfaces facing the dry etching apparatus 14 and the ion implantation apparatus 14', respectively, and semiconductor substrate withdrawing sections 11-2 formed on the surfaces opposite to the surfaces on which the semiconductor substrate introducing sections 11-1 are formed. The oxidation and diffusion apparatus 12 includes a semiconductor substrate introducing section 12-1 and a semiconductor substrate withdrawing section 12-2 formed on the same surface facing one of the two cleaning apparatuses 11. Further, the CVD apparatus 12' includes a semiconductor substrate introducing section 12'-1 and a semiconductor substrate withdrawing section 12'-2 formed on the same surface facing the other cleaning apparatus 11.

The flow of the semiconductor substrate in the layout described above will now be described with reference to FIG. 5. In FIG. 5, the flow of the transfer box housing the semiconductor substrate is denoted by arrows of solid lines, and the flow of the vacant transfer box is opposite to the flow denoted by the arrows of the solid lines.

In the first step, the semiconductor substrate introduced into the clean room 10 is subjected to a lithography process in the lithography apparatuses 13, 13 (first manufacturing process stage). At this time, the semiconductor substrate is coated with a resist film.

Then, the semiconductor substrate, which is housed in the transfer box (transfer box provided with resist) is transferred into the dry etching apparatus 14. In the dry etching apparatus 14, an etching treatment is applied to the semiconductor substrate with the resist used as a mask. Alternatively, the semiconductor substrate is transferred into the ion implantation apparatus 14' for application of an ion implantation treatment to the semiconductor substrate (the dry etching apparatus 14, the ion implantation apparatus 14': second manufacturing process stage).

The semiconductor substrate is contaminated with the resist residue, the gas formed by the reaction in the dry etching step, or with the gas used for the ion implantation in the etching process or in the ion implantation process. Therefore, the semiconductor substrate is housed in another transfer box (transfer box having a low cleanliness) so as to be transferred into the cleaning apparatuses 11, 11 (third manufacturing process stage, second manufacturing apparatus). Then, the semiconductor substrate is washed in the cleaning apparatuses 11, 11.

The semiconductor substrate after the washing is housed again in another transfer box (transfer box of a high cleanliness) so as to be transferred into the oxidation and diffusion apparatus 12 or the CVD apparatus 12'. As a result, the oxidation and diffusion treatment or the CVD treatment is applied to the semiconductor substrate within the manufacturing apparatus 12 or 12'.

The semiconductor substrate having the oxidation and diffusion treatment or the CVD treatment applied thereto is housed in a transfer box having a high cleanliness and, then, transferred again into the lithography apparatus 13 for receiving a lithography treatment. Alternatively, the semiconductor substrate housed in the transfer box of a high cleanliness is transferred into the CMP apparatus 15 and the sputtering apparatus 16. As a result, a CMP treatment and a sputtering treatment are applied to the semiconductor substrate.

Where the operation of the clean room is performed with attentions paid to every cleanliness of the transfer box, the transfer box to which resist is attached is reciprocated only between the lithography apparatus 13 and the dry etching apparatus 14 and between the lithography apparatus 13 and the ion implantation apparatus 14'. On the other hand, the transfer box having a low cleanliness is reciprocated among the dry etching apparatus 14, the ion implantation apparatus 14', the sputtering apparatus 16, the CMP apparatus 15 and the cleaning apparatus 11. Also, the transfer box having the highest cleanliness is reciprocated among the cleaning apparatus, the oxidation and diffusion apparatus 12 and the CVD apparatus 12'. It should be noted, however, that the semiconductor substrate subjected to the processing in the oxidation and diffusion apparatus 12 and the CVD apparatus 12' is transferred by a transfer box having a high cleanliness to the apparatus for performing the next treatment (i.e., the lithography apparatus 12 in this case).

In the case of the layout of the manufacturing apparatuses described above, the transfer box housing the semiconductor substrate is substantially transferred constantly in the clockwise direction, and the vacant transfer box is transferred constantly in the opposite direction, i.e., in the counterclockwise direction. Also, the region in which the transfer box is reciprocated is limited depending on the cleanliness.

Figure 6:
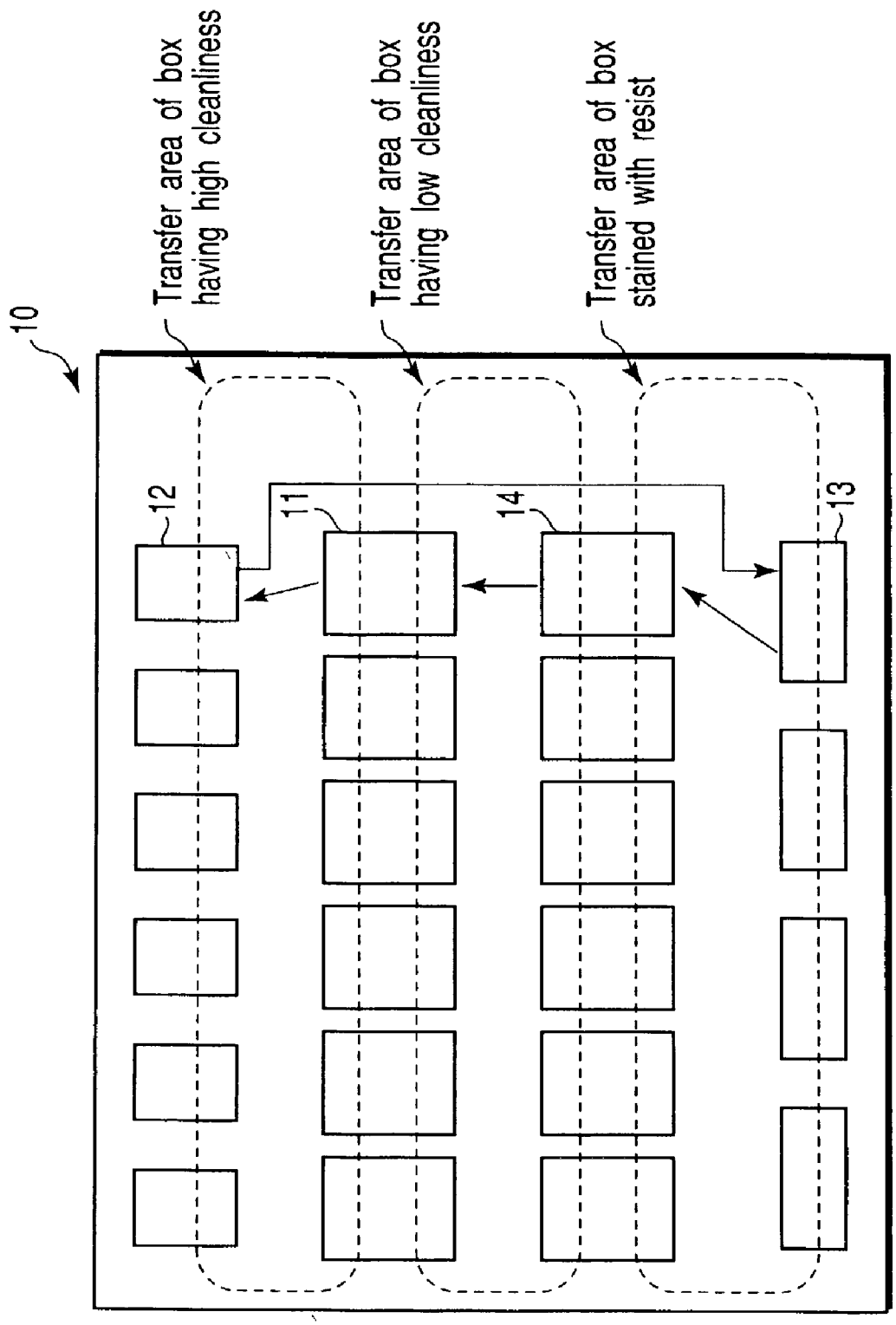
FIG. 6 shows a layout of manufacturing apparatuses of a semiconductor device within a clean room according to the second embodiment of the present invention.

FIG. 6 covers the case where the layout of the manufacturing apparatuses described above is applied to a large scale clean room. In other words, FIG. 6 shows the layout of the manufacturing apparatuses within the clean room, and the drawing is simplified with attentions paid to only the flow of the transfer box.

As shown in the drawing, an area within which a transfer box to which resist is attached is transferred, an area within which a transfer box of a low cleanliness is transferred, and an area within which a transfer box of a high cleanliness is transferred are separated from each other within the clean room 10. It is clearly seen that the transferring distance of the transfer box among the manufacturing apparatuses is markedly shorter than that in the prior art.

As described above, in the manufacturing apparatus according to the second embodiment of the present invention, the semiconductor substrate introducing section and the semiconductor substrate withdrawing section are formed on the opposite surfaces, not on the same surface. In the case of using the manufacturing apparatuses of the particular construction, the flow of the transfer box housing the semiconductor substrate and the flow of the vacant transfer box become constant. As a result, the transferring supervision of the transfer box can be simplified. Also, the transferring distance of the transfer box can be shortened, and the transferring route can be simplified.

Further, the region in which the transfer box is transferred can be limited for every cleanliness. Therefore, it is possible to use the cleanliness of an exclusive transfer box for every cleanliness required for each process step. To be more specific, since the transfer box for each cleanliness is not transferred to the outside of the area, it is possible to use a transfer box capable of controlling the internal environment of the box such that an amine giving an adverse effect to the resist can be removed as, for example, a transfer box for transferring a semiconductor substrate to which is attached resist. Since each transfer box can be supervised for each cleanliness, it is possible to maintain the semiconductor substrate at the best cleanliness. Also, the transferring supervision of the transfer box and the cleanliness supervision within the clean room can be facilitated.

Incidentally, the second embodiment was described above with attentions paid to the cleaning step, the film-deposition step, the lithography step and the processing and ion implantation step as the fundamental flow in the manufacturing process of the semiconductor device. However, additional apparatuses are required in the actual manufacturing process of the semiconductor device. For example, it is also necessary to use a CMP apparatus and a sputtering apparatus. It is possible to determine in view of the operation of the transfer box whether these CMP apparatus and sputtering apparatus are to be positioned adjacent to the cleaning apparatus in the lateral direction, adjacent to the dry etching apparatus in the lateral direction, or adjacent to the oxidation and diffusion apparatus in the lateral direction. For example, since the semiconductor substrate having a film formed thereon is polished in the CMP step, it is possible to form the semiconductor substrate introducing section of the CMP apparatus in a manner to form a pair with the semiconductor substrate withdrawing section of the film-deposition apparatus and to form the semiconductor substrate withdrawing section of the CMP apparatus in a manner to form a pair with the semiconductor substrate introducing section of the cleaning apparatus. Alternatively, it is desirable for the semiconductor substrate withdrawing section of the CMP apparatus to be arranged in the area in which the semiconductor substrate introducing section of the cleaning apparatus is arranged and for the CMP apparatus to be arranged so as to be positioned adjacent to the cleaning apparatus in the lateral direction.

Figure 7:
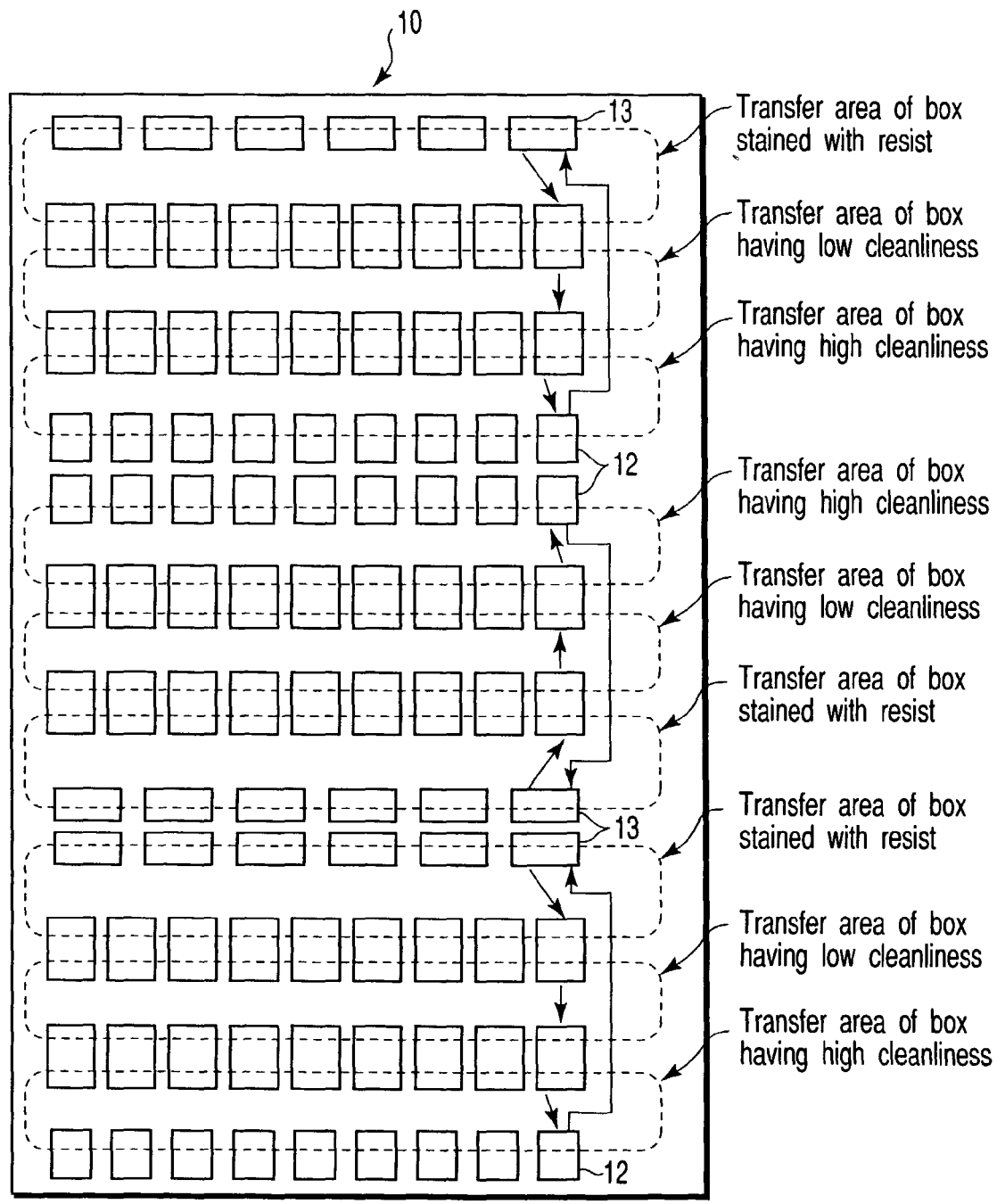
FIG. 7 shows a layout of manufacturing apparatuses of a semiconductor device within a clean room according to a third embodiment of the present invention.

A manufacturing apparatus and a manufacturing system of a semiconductor device according to a third embodiment of the present invention will now be described with reference to FIG. 7. FIG. 7 shows the layout of the manufacturing apparatuses within the clean room 10. The drawing is simplified with attentions paid to only the flow of the transfer box.

The third embodiment is directed to an example of a clean room having a scale larger than that of the second embodiment. As shown in FIG. 7, in the third embodiment of the present invention, a plurality of layouts each shown in FIG. 5 described previously in conjunction with the second embodiment are arranged back to back with the arrangement line of the lithography apparatus 13, the oxidation-diffusion apparatus 12 and the CVD apparatus 12' providing the axis of symmetry so as to form three stages. In the particular arrangement, the area in which the transfer box of each cleanliness is transferred can be limited even in the case of a large scale clean room having a very large number of manufacturing apparatuses arranged therein so as to make it possible to obtain the effect similar to that obtained in the second embodiment.

A manufacturing apparatus and a manufacturing system of a semiconductor device according to a fourth embodiment of the present invention will now be described with reference to FIG. 8. FIG. 8 shows the layout of the manufacturing apparatuses within a clean room. The layout shown in FIG. 8 has been determined in view of the flow of the manufacturing process of the semiconductor device.

When it comes to the operation mode of the transfer box described previously in conjunction with the first to third embodiments of the present invention, the transfer box housing the semiconductor substrate is replaced every time the semiconductor substrate is processed within the manufacturing apparatus. Therefore, it is necessary to use a facility for moving the supervising tag accompanying the transfer box from the semiconductor substrate introducing section to the semiconductor substrate withdrawing section. However, the fourth embodiment makes it possible to operate the transfer box without requiring a facility for moving the supervising tag.

In the first step, a recording medium such as a magnetic card is attached to each of the transfer boxes transferred within the clean room. Incidentally, the recording medium attached to the transfer box is not limited to a magnetic card. To be more specific, the recording medium is not particularly limited as far as it is possible to write information in and to read the written information from the recording medium. Then, writing apparatuses 11-4 to 15-4 for writing the semiconductor substrate discriminating code or the information such as the situation of the manufacturing process into the magnetic card attached to the transfer box are mounted on the semiconductor substrate withdrawing sections 11-2 to 15-2 of the manufacturing apparatuses 11 to 15, respectively, as shown in FIG. 8. Also, reading apparatuses 11-3 to 15-3 for reading the information written into the magnetic card by the writing apparatuses 11-4 to 15-4 are mounted on the semiconductor substrate introducing sections 11-1 to 15-1 of the manufacturing apparatuses 11 to 15, respectively.

For example, the semiconductor substrate put into the clean room is washed first in the cleaning apparatus 11. When the transfer box housing the semiconductor substrate is set in the semiconductor substrate introducing section 11-1 of the cleaning apparatus 11, the reading apparatus 11-3 mounted on the semiconductor substrate introducing section 11-1 reads, for example, the semiconductor substrate discriminating code from the magnetic card attached to the transfer box. Then, the transfer box housing the semiconductor substrate having the washing treatment applied thereto is withdrawn through the semiconductor substrate withdrawing section 11-2 of the cleaning apparatus 11. At this time, the writing apparatus 11-4 mounted on the semiconductor substrate withdrawing section 11-2 writes the semiconductor substrate discriminating code, the transfer instruction to the next process step and the information such as the situation of the processing into the magnetic card based on the information read by the reading apparatus 11-3 and the treatment performed in the cleaning apparatus 11.

In accordance with the information written by the writing apparatus 11-4, the transfer box is automatically transferred into the next process step, i.e., into the heat treatment and CVD apparatus 12. When the transfer box is put into the semiconductor substrate introducing section 12-1 of the heat treatment-CVD apparatus 12, the reading apparatus 12-3 mounted on the semiconductor substrate introducing section 12-1 reads the information after the washing treatment, which is written in the magnetic card. Further, the writing apparatus 12-4 mounted to the semiconductor substrate withdrawing section 12-2 writes new information into the magnetic card attached to the next transfer box. Similar operations are repeated subsequently in this fashion in respect of each of the lithography apparatus 13, the RIE and ion implantation apparatus 14 and the CMP apparatus 15.

By using the manufacturing apparatuses of the construction described above, the transfer of the transfer box can be supervised without requiring the movement of the supervising tag so as to simplify the transferring supervision. Of course, the fourth embodiment of the present invention can also be applied to a large scale clean room as described previously in conjunction with the second and third embodiments of the present invention.

As described previously in conjunction with the first to fourth embodiments of the present invention, it is possible in the embodiment of the present invention to arrange the manufacturing apparatus within the clean room such that the semiconductor substrate introducing section and the semiconductor substrate withdrawing section are not present on the same surface. By the particular arrangement, it is possible to improve the transferring efficiency of the semiconductor substrate and to improve the operating efficiency of the transfer box.

To be more specific, it is possible to eliminate the partition between the working area and the utility area by automatically transferring the transfer box. As a result, the degree of freedom is improved in the of the manufacturing apparatuses within the clean room. Also, it is possible to arrange the manufacturing apparatuses in a manner to partition the transfer area of the transfer box used for transferring the semiconductor substrate between the manufacturing apparatuses in accordance with the required cleanliness. If the transferring route of the transfer box is to be optimized in this case, it is most desirable to use a manufacturing apparatus including a semiconductor substrate introducing section and a semiconductor substrate withdrawing section, which are not necessarily arranged on the same surface. In other words, the embodiment of the present invention is not limited to the manufacturing apparatus having the semiconductor substrate introducing section and the semiconductor substrate withdrawing section formed on the different surface. Also, the arrangement of the manufacturing apparatuses that permits partitioning the transfer area of the transfer box depending on the required cleanliness is included in the scope of the embodiment of the present invention. As a result, the semiconductor substrate introducing section and the semiconductor substrate withdrawing section are formed on different surfaces in some of the manufacturing apparatuses arranged within the clean room.

As described above, the layout of the manufacturing apparatuses is not limited to those described previously in conjunction with the first to third embodiments of the present invention. It is considered reasonable to understand that various layouts of the manufacturing apparatuses, which permit partitioning the transfer area of the transfer box in accordance with the operation of the clean room, constitute embodiments of the present invention.

For example, in the case of the layout of small scale manufacturing apparatuses as shown in FIG. 3, the semiconductor substrate introducing section and the semiconductor substrate withdrawing section are formed on different surfaces of any of the cleaning and resist removing apparatus 11, the heat treatment and CVD apparatus 12, the lithography apparatus 13 and the RIE and ion implantation apparatus 14 in the first embodiment of the present invention. However, when it comes to a system including five manufacturing apparatuses including the four manufacturing apparatus noted above and an additional CMP apparatus 15, it suffices for the semiconductor substrate introducing section 15-1 and the semiconductor substrate withdrawing section 15-2 to be formed on different surfaces in respect of the CMP apparatus 15 alone, as shown in FIG. 9.

As described above, according to the embodiments of the present invention, the arranging positions of the manufacturing apparatuses and the positions of the semiconductor substrate introducing section and the semiconductor substrate withdrawing section of the manufacturing apparatus are determined in view of the manufacturing process of the semiconductor device or the transferring efficiency of the semiconductor substrate within the clean room. As a result, the flow of the semiconductor substrate transfer box holding the semiconductor substrate is determined in one direction so as to simplify the transferring step and to optimize the transferring distance. Also, since the transfer box and the semiconductor substrate cassette can be operated independently in accordance with the cleanliness, the transferring supervision of the transfer box and the cleanliness supervision within the clean room can be facilitated. Further, since a recording medium capable of writing and reading information is attached to the transfer box so as to read and write information on the semiconductor substrate every time the semiconductor substrate is processed in each of the manufacturing apparatuses, it is possible to omit the movement of a supervising tag.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing system of a semiconductor device, comprising:
 a first manufacturing apparatus;
 a second manufacturing apparatus;
 a third manufacturing apparatus,
 wherein each of the first, second, and third manufacturing apparatus comprises:
  an introducing section, a process section having a surface, the introducing section being provided on the surface of the process section, and a withdrawing section which is arranged on a surface of the process section differing from the surface on which the introducing section is arranged;

a first plurality of transfer boxes associated with a first region including the introducing section of the second manufacturing apparatus and the withdrawing section of the first manufacturing apparatus;

a second plurality of transfer boxes associated with a second region including the withdrawing section of the second manufacturing apparatus and the introducing section of the third manufacturing apparatus;

a first transfer box being selected from the first plurality of transfer boxes, the first transfer box having a first environment therein, a second transfer box being selected from the second plurality of transfer boxes, the second transfer box having a second environment therein, wherein a third environment surrounds at least one of the first, second, and third manufacturing apparatuses, the introducing section of the second manufacturing apparatus being configured to introduce the first transfer box holding the semiconductor substrate therein, the process section of the second manufacturing apparatus being configured to apply a process to the semiconductor substrate, the withdrawing section of the second manufacturing apparatus being configured to withdraw the second transfer box holding the semiconductor substrate after the semiconductor substrate has been discharged from the process section of the second manufacturing apparatus, and wherein the first environment has a cleanliness higher than the third environment while the semiconductor substrate is held in the first transfer box, and the second environment has a cleanliness higher than the third environment while the semiconductor substrate is held in the second transfer box.

2. The manufacturing system of a semiconductor device according to claim 1, further comprising:

a reading apparatus which is mounted on the introducing section of said at least one of the first, second, and third manufacturing apparatuses and reads the information on the semiconductor substrate put in the introducing section from a recording medium mounted on the first transfer box; and a writing apparatus which is mounted on the withdrawing section of said at least one of the first, second, and third manufacturing apparatuses and writes the information read by the reading apparatus and the information on the processing performed in the process section in a recording medium attached to the second transfer box withdrawn from the withdrawing section.

3. The manufacturing system of a semiconductor device according to claim 1, wherein the information on the semiconductor substrate includes at least one of a discriminating code of the semiconductor substrate, the situation of the manufacturing process, and a transfer instructing information to the next process step.

4. A manufacturing system of a semiconductor device, comprising:

a plurality of manufacturing apparatuses of a semiconductor device each including an introducing section configured to introduce a first transfer box having a first environment therein, the first transfer box holding a semiconductor substrate therein, a process section which takes in the semiconductor substrate put in the introducing section and applies a processing to the semiconductor substrate, and a withdrawing section configured to withdraw a second transfer box having a second environment therein, the second transfer box holding the semiconductor substrate discharged from the process section, the second transfer box differing from the first transfer box, the withdrawing section of at least one of the manufacturing apparatuses being arranged to face the introducing section of the adjacent manufacturing apparatus, and the withdrawing section and the introducing section of at least one of the manufacturing apparatuses being arranged on different surfaces of the manufacturing apparatus, wherein a third environment surrounds at least one of a plurality of manufacturing apparatuses, the first environment has a cleanliness higher than the third environment while the semiconductor substrate is held in the first transfer box, and the second environment has a cleanliness higher than the third environment while the semiconductor substrate is held in the second transfer box.

5. The manufacturing system of a semiconductor device according to claim 4, further comprising:

a reading apparatus which is mounted on the introducing section and reads the information on the semiconductor substrate put in the introducing section from a recording medium mounted on the first transfer box; and a writing apparatus which is mounted on the withdrawing section and writes the information read by the reading apparatus and the information on the processing performed in the manufacturing apparatus in a recording medium attached to the second transfer box withdrawn from the withdrawing section.

6. The manufacturing system of a semiconductor device according to claim 5, wherein the information on the semiconductor substrate includes at least one of a discriminating code of the semiconductor substrate, the situation of the manufacturing process, and a transfer instructing information to the next process step.

7. A manufacturing system of a semiconductor device, comprising:

a first manufacturing apparatus of the semiconductor device including a process section which applies a prescribed processing to a semiconductor substrate, and a withdrawing section configured to withdraw a first transfer box holding the semiconductor substrate discharged from the process section, said first transfer box having a first environment therein;

a second manufacturing apparatus of a semiconductor device including an introducing section which is arranged to face the withdrawing section of the first manufacturing apparatus and configured to receive the first transfer box holding the semiconductor substrate, a process section which takes in the semiconductor substrate put on the introducing section and applies a prescribed treatment to the semiconductor substrate, and a withdrawing section which is arranged on the surface differing from the surface on which the introducing section is arranged and which is configured to withdraw a second transfer box differing from the first transfer box and holding the semiconductor substrate withdrawn from the process section, said second transfer box having a second environment therein; and a third manufacturing apparatus of a semiconductor device including an introducing section which is arranged to face the withdrawing section of the second manufacturing apparatus and configured to receive the second transfer box holding the semiconductor substrate, and a process section which takes in the semiconductor substrate put on the introducing section and applies a prescribed processing to the semiconductor substrate, the second manufacturing apparatus being configured to put the first transfer box back to the first manufacturing apparatus after taking the semiconductor substrate from the first transfer box into the process section, and the third manufacturing apparatus being configured to put the second transfer box back to the second manufacturing apparatus after taking the semiconductor substrate from the second transfer box into the process section, wherein a third environment surrounds at least one of the first, second, and third manufacturing apparatuses, the first environment has a cleanliness higher than the third environment while the semiconductor substrate is held in the first transfer box, and the second environment has a cleanliness higher than the third environment while the semiconductor substrate is held in the second transfer box.

8. The manufacturing system of a semiconductor device according to claim 7, further comprising:

a first manufacturing process stage of a semiconductor device in which a plurality of the first manufacturing apparatuses is arranged;

a second manufacturing process stage of a semiconductor device in which a plurality of the second manufacturing apparatuses is arranged; and a third manufacturing process stage of a semiconductor device in which a plurality of the third manufacturing apparatuses is arranged, wherein the first and second manufacturing process stages are configured to reciprocate the first transfer box to each other, and the second and third manufacturing process stages are configured to reciprocate the second transfer box to each other.

9. The manufacturing system of a semiconductor device according to claim 7, wherein the first and second transfer boxes are first and second cleanliness, respectively, at least one of the second manufacturing apparatuses is a cleaning apparatus which washes the semiconductor substrate processed in the first manufacturing apparatus; and the transfer box reciprocated between the second and third manufacturing apparatuses has the second cleanliness higher than the first cleanliness so as to maintain the cleanliness on the surface of the semiconductor substrate after the washing treatment performed in the cleaning apparatus.

10. The manufacturing system of a semiconductor device according to claim 7, wherein each of the second and third manufacturing apparatus further comprises:

a reading apparatus which is mounted on the introducing section and reads the information on the semiconductor substrate put in the introducing section from a recording medium mounted on the first transfer box or second transfer box; and the second manufacturing apparatus further comprises a writing apparatus which is mounted on the withdrawing section and writes the information read by the reading apparatus and the information on the processing performed in the process section in a recording medium attached to the second transfer box withdrawn through the withdrawing section.

11. The manufacturing system of a semiconductor device according to claim 7, further comprising a film-deposition apparatus including an introducing section and a process section, wherein the first manufacturing apparatus is a lithography apparatus which applies a lithography treatment to the semiconductor substrate;

the second manufacturing apparatus is one of an etching apparatus and an ion implantation apparatus, which respectively applies an etching treatment and an ion implantation treatment on the semiconductor substrate subjected to the lithography treatment, one of the etching apparatus and the ion implantation apparatus having the withdrawing section formed on a surface opposite to the surface on which the introducing section is arranged;

the third manufacturing apparatus is a cleaning apparatus which washes the semiconductor substrate subjected to one of the etching treatment and the ion implantation treatment and further comprises a withdrawing section arranged on a surface opposite to the surface on which the introducing section is arranged and configured to withdraw a third transfer box, differing from the second transfer box and holding the semiconductor substrate withdrawn from the process section being withdrawn onto the withdrawing section;

the introducing section of the film-deposition apparatus is arranged on the surface facing the withdrawing section of the cleaning section and receives the third transfer box holding the semiconductor substrate washed in the cleaning apparatus; and the process section of the film-deposition apparatus takes in the semiconductor substrate put in the introducing section and applies a film-deposition treatment to the semiconductor substrate.

* * * * *